US007097956B2

(12) United States Patent
Miyamoto et al.

(10) Patent No.: US 7,097,956 B2
(45) Date of Patent: Aug. 29, 2006

(54) IMAGEABLE ELEMENT CONTAINING SILICATE-COATED POLYMER PARTICLE

(75) Inventors: Yasushi Miyamoto, Tatebayashi (JP); Eiji Hayakawa, Utsunomiya (JP); Paul R. West, Fort Collins, CO (US); Jianbing Huang, Trumbull, CT (US)

(73) Assignee: Eastman Kodak Company, Rochester, NY (US)

(*) Notice: Subject to any disclaimer, the term of this patent is extended or adjusted under 35 U.S.C. 154(b) by 153 days.

(21) Appl. No.: 10/353,195

(22) Filed: Jan. 27, 2003

(65) Prior Publication Data

US 2004/0146799 A1 Jul. 29, 2004

(51) Int. Cl.
*G03F 7/004* (2006.01)

(52) U.S. Cl. ................ 430/270.1; 430/138; 430/271.1; 430/272.1; 430/273.1; 430/302; 430/494; 430/944; 430/945

(58) Field of Classification Search ................ 430/138, 430/270.1, 271.1, 272.1, 273.1, 302, 494, 430/944, 945
See application file for complete search history.

(56) References Cited

U.S. PATENT DOCUMENTS

| | | | | |
|---|---|---|---|---|
| 6,399,270 | B1 * | 6/2002 | Mori et al. | 430/270.1 |
| 6,465,154 | B1 * | 10/2002 | Fromson et al. | 430/302 |
| 6,653,042 | B1 * | 11/2003 | Fukino et al. | 430/270.1 |
| 6,686,125 | B1 * | 2/2004 | Hoshi et al. | 430/271.1 |
| 6,779,793 | B1 * | 8/2004 | Behrens et al. | 271/283 |

FOREIGN PATENT DOCUMENTS

| | | |
|---|---|---|
| EP | 1 038 666 A2 | 9/2000 |
| EP | 1 266 767 A2 | 12/2002 |
| JP | 06-043656 | 2/1994 |
| JP | 11-095416 | 4/1999 |
| JP | 11-254848 | 9/1999 |
| JP | 2000-235255 | 8/2000 |

* cited by examiner

*Primary Examiner*—Barbara L. Gilliam
(74) *Attorney, Agent, or Firm*—J. Lanny Tucker

(57) ABSTRACT

Imageable elements that contain silicate-coated polymer particles in the imageable layer, stacks of these elements, and methods for forming images using these elements are disclosed. The elements do not stick to each other when stacked without interleaving paper, and only one imageable element is lifted at a time when the imageable elements are handled by automatic processing equipment. Blanket piling is not observed when silicate-coated particles are present in the imageable layer.

26 Claims, No Drawings

IMAGEABLE ELEMENT CONTAINING SILICATE-COATED POLYMER PARTICLE

FIELD OF THE INVENTION

The invention relates to imageable elements useful as lithographic printing plate precursors. In particular, this invention relates to imageable elements that comprise silicate-coated polymer particles in the imageable layer.

BACKGROUND OF THE INVENTION

In lithographic printing, ink receptive regions, known as image areas, are generated on a hydrophilic surface. When the surface is moistened with water and ink is applied, the hydrophilic regions retain the water and repel the ink, and the ink receptive regions accept the ink and repel the water. The ink is transferred to the surface of a material upon which the image is to be reproduced. Typically, the ink is first transferred to an intermediate blanket, which in turn transfers the ink to the surface of the material upon which the image is to be reproduced.

Imageable elements useful as lithographic printing plates, also called printing plate precursors, typically comprise an imageable layer applied over the hydrophilic surface of a substrate. The imageable layer typically comprises one or more radiation-sensitive components, which may be dispersed in a suitable binder. Alternatively, the radiation-sensitive component can also be the binder material. If, after imaging, the imaged regions of the imageable layer are removed in the developing process revealing the underlying hydrophilic surface of the substrate, the precursor is positive-working. Conversely, if the unimaged regions are removed by the developing process, the precursor is negative-working. In each instance, the regions of the imageable layer (i.e., the image areas) that remain are ink-receptive, and the regions of the hydrophilic surface revealed by the developing process accept water and aqueous solutions, typically a fountain solution, and repel ink.

Prior to use, printing plate precursors are usually stacked on top of each other during shipping and storage. Adjacent precursors have interposed there between a protective interleaving paper or some other type of interleaf that intimately contacts the surface of the imageable element and prevents the precursors from sticking together. This interleaving paper is removed from the imageable layer prior to imaging.

Imageable elements that are to be imaged by exposure through a photomask typically have a matte layer on the surface to prevent the photomask from sticking to the imageable element during imaging. This matte layer also prevents the interleaving paper from sticking too strongly to the imageable element so that the interleaving paper can be easily released by an automatic interleaving paper releasing machine.

Direct digital imaging of printing plate precursors, which obviates the need for imaging through a photomask, is becoming increasingly important in the printing industry. Because these imageable elements are imaged without a photomask, the imageable layer does not have a matte layer so the interleaving paper would have to be placed directly on the imageable layer. However, when the interleaving paper is placed directly on the imageable layer, the contact area between the imageable layer and the interleaving paper becomes larger and the sheets stick to each other. When the interleaving paper and the imageable layer stick to each other, it becomes difficult to release the interleaving paper with an automatic interleaving paper releasing machine and problems arise, such as paper jamming in the automatic interleaving paper releasing machine. However, when the interleaving paper is omitted, the precursors have a tendency to stick to each other and, thus, can not be easily handled by automatic processing equipment.

Thus, a need exists for imageable elements useful as lithographic printing plate precursors that do not require an interleaving paper yet do not stick to each other when the interleaving paper is omitted so that they can be easily handled by automatic processing equipment.

SUMMARY OF THE INVENTION

In one aspect, the invention is an imageable element useful as a lithographic printing plate precursor. The element comprises a substrate and an imageable layer over the substrate in which:

the imageable layer comprises an imageable composition and about 0.01 wt % to 10 wt % of silicate-coated polymer particles, based on the weight of the imageable layer;

the silicate-coated polymer particles have a diameter of about 1 micron to about 20 microns; and the imageable element comprises a photothermal conversion material.

In another aspect, the invention is a method for forming an image, the method comprising the steps of:

imaging an imageable element without the use of a photomask and forming imaged regions and complementary unimaged regions in the imageable element; and developing the imageable element with a developer and removing either the imaged or the unimaged regions;

in which:

the imageable element comprises an imageable layer over a substrate;

the imageable layer comprises an imageable composition and about 0.01 wt % to 10 wt % of silicate-coated polymer particles, based on the weight of the imageable layer; and the silicate-coated polymer particles have a diameter of about 1 micron to about 20 microns.

In another aspect, the invention is a stack of imageable elements in which:

the imageable elements each comprise an imageable layer over a substrate;

the imageable layer comprises an imageable composition and about 0.01 wt % to 10 wt % of silicate-coated polymer particles, based on the weight of the imageable layer;

the silicate-coated polymer particles have a diameter of about 1 micron to about 20 microns;

the stack comprises between 20 and 1000 imageable elements; and the imageable layer of each imageable element is in direct contact with the substrate of each successive imageable element in the stack.

DETAILED DESCRIPTION OF THE INVENTION

Unless the context indicates otherwise, in the specification and claims, the terms polymer particles, phenolic polymer, and similar terms include mixtures of such materials. Unless otherwise specified, all percentages are percentages by weight. Polymer particles refers to particles or beads of organic polymers, such as polystyrene, crosslinked polystyrene, poly(methyl methacrylate), crosslinked poly(methyl methacrylate), acrylate and/or methacrylate polymers and copolymers, etc.

Imageable Elements

The imageable element comprises an imageable layer over the surface of a substrate.

Imageable Layer

The imageable layer comprises an imageable composition and silicate-coated polymer particles.

Silicate-Coated Polymer Particles

The presence of polymer particles in the imageable layer improves the transportation property of the imageable elements. When the imageable layer comprises polymer particles, the elements do not stick to each other when stacked without interleaving paper. Only one imageable element is lifted at a time when the imageable elements are handled by automatic processing equipment.

However, the presence of polymer particles can cause blanket piling when the imageable element is imaged, processed, and used as a lithographic printing plate. Blanket piling, the build-up of ink on the blanket within non-image (i.e., non-printing) areas of the printing plate, can cause toning in the background areas of the printed material. In addition, the press needs to be stopped more frequently for blanket cleaning where piling is a problem. Although blanket piling occurs when uncoated polymer particles are present in the imageable layer, blanket piling does not occur when silicate-coated polymer particles are present in the imageable layer.

If the silicate-coated polymer particles are too small, their effectiveness in improving transportability is reduced. If the silicate-coated polymer particles are too large, image resolution will be adversely affected. The silicate-coated polymer particles typically have a diameter of about 1 micron to about 20 microns, preferably about 3 microns to about 10 microns, and more preferably about 5 microns to about 8 microns. The silicate coated polymer particles preferably have a diameter between about three to about six times the thickness of the imageable layer.

In general, the silicate-coated polymer particles comprise about 0.01 wt % to 10 wt %, typically about 0.1 wt % to about 2 wt %, more typically about 0.2 wt % to about 1 wt % of the imageable layer, based on the weight of the imageable layer. However, the amount of silicate-coated polymer particles present in the imageable layer will typically be dependent on particle size and the thickness of the imageable layer. Preferably, the imageable layer comprises about 10 to about 500, more preferably about 20 to about 200, silicate-coated polymer particles per $mm^2$ of the imageable layer.

Methods for the preparation of silicate-coated polymer particles are well known to those skilled in the art. For example, suitably sized polymer particles may be passed through a fluidized bed or heated moving or rotating fluidized bed of colloidal silica particles, the temperature of the bed being such to soften the surface of the polymeric particles thereby causing the colloidal silica particles to adhere to the polymer particle surface. Another technique suitable for preparing polymer particles surrounded by a layer of colloidal silica is to spray dry the particles from a solution of the polymeric material in a suitable solvent and then before the polymer particles solidify completely, passing the polymer particles through a zone of colloidal silica wherein the coating of the particles with a layer of the colloidal silica takes place.

Silicate-coated polymer particle preparation by limited coalescence includes the "suspension polymerization" technique and the "polymer suspension" technique. In the "suspension polymerization" technique, an addition polymerizable monomer or mixture of addition polymerizable monomers, is added to an aqueous medium containing a particulate suspension of colloidal silica to form a discontinuous (oil droplets) phase in a continuous (water) phase. The mixture is subjected to shearing forces by agitation, homogenization and the like to reduce the size of the droplets. After shearing is stopped, the oil droplets reach equilibrium size due to the stabilizing action of the colloidal silica stabilizer coating the surface of the droplets. Polymerization is completed to form an aqueous suspension of polymer particles in an aqueous phase having a uniform layer thereon of colloidal silica. This process is described in Wiley, U.S. Pat. No. 2,932,629; Bayley, U.S. Pat. No. 4,148,741, and Wernli, U.S. Pat. No. 4,248,741.

The polymer particles may be produced by, for example, by adding a conventional radical polymerization initiator to an addition-polymerizable monomer or mixture of addition polymerizable monomers in an organic solvent, followed by thermal polymerization. Typical additional polymerizable monomers are acrylic acid; methacrylic acid; acrylates and methacrylates such as methyl acrylate and methacrylate, ethyl acrylate and methacrylate, propyl acrylate and methacrylate, butyl acrylate and methacrylate, 2-ethylhexyl acrylate and methacrylate, octyl acrylate and methacrylate, and 2-hydroxyethyl acrylate and methacrylate; vinyl naphthalene; vinyl benzoate; vinyl acetate; vinyl ethers such as vinyl methyl ether, vinyl isobutyl ether and vinyl ethyl ether; and styrenes, such as alpha methyl styrene, t-butyl styrene, p-chlorostyrene; and stryrene.

A crosslinking monomer or mixture of crosslinking monomers may also be present to crosslink the polymer. When present, typically about 0.5 wt % to 50 wt %, more typically about 25 wt % to 50 wt %, of the crosslinking monomer or mixture of crosslinking monomers is present in the monomer mixture. Typical crosslinking monomers are: ethylene glycol diacrylate and dimethacrylate, diethylene glycol diacrylate and dimethacrylate, divinyl ether, and divinyl benzene. Typical thermal initiators are persulfates; peroxides, such as dibenzoyl peroxide; and azo compounds, such as azo-bis-iso-butyronitrile (AIBN).

In the "polymer suspension" technique, a suitable polymer is dissolved in a solvent and this solution is dispersed as fine water-immiscible liquid droplets in an aqueous solution that contains colloidal silica as a stabilizer. Typically, the polymers used in this technique will not be crosslinked. Equilibrium is reached, and the solvent is removed from the droplets by evaporation or other suitable technique producing polymeric particles having a uniform coating thereon of colloidal silica. This process is described in Nair, U.S. Pat. No. 4,833,060. Useful solvents are those that dissolve the polymer, are immiscible with water, and are readily removed from the polymer droplets such as, for example, methylene chloride, methyl ethyl ketone, ethyl acetate, trichloromethane, ethylene chloride, trichloroethane, cyclohexanone, toluene, and xylene. A particularly useful solvent is methylene chloride because it is a good solvent for many polymers, is immiscible with water, and can be readily removed by evaporation.

The quantities of the ingredients and their relative relationships to each other can vary over wide ranges. However, typically the ratio of the polymer to the solvent should be about 1 to about 80% by weight of the combined weight of the polymer and the solvent. The combined weight of the polymer and the solvent should be about 25 to about 50% by weight of the added water. The size and quantity of the colloidal silica depends upon the size of the particles of the colloidal silica and upon the size of the polymer droplet particles desired. Thus, as the size of the polymer/solvent droplets is reduced by high shear agitation, the quantity of solid colloidal is varied to prevent uncontrolled coalescence of the droplets and to achieve uniform size and narrow size distribution of the resulting polymer particles.

Imageable Composition

The imageable composition may be positive working or negative working and may be photoimageable (i.e., imageable by ultraviolet and/or visible radiation by exposure with an appropriate laser or with a digital light processor) or thermally imageable (i.e., imageable by infrared radiation or with a hot body, such as with a thermal head or an array of thermal heads). The imageable layer may be on the substrate, or other layers, such as an underlayer or an absorber layer, may be present between the imageable layer and the substrate. Typically, there is no layer over the imageable layer. Thus, the surface of the imageable layer of a first imageable element is in contact with the surface of the substrate of a second imageable element when the second imageable element is stacked over the first imageable element without an intervening interleaving paper.

Photothermal Conversion Materials

Elements that are to be imaged with infrared radiation comprise a photothermal conversion material. In the elements that do not comprise an underlayer, the photothermal conversion material is in the imageable layer and/or in a separate absorber layer between the imageable layer and the substrate. In elements that also comprise an underlayer, the photothermal conversion material may be in the imageable layer, and/or in the underlayer, and/or in a separate absorber layer between the imageable layer and the underlayer.

Photothermal conversion materials absorb radiation and convert it to heat. Photothermal conversion materials may absorb ultraviolet, visible, and/or infrared radiation and convert it to heat. Although the polymeric material in the underlayer may itself comprise an absorbing moiety, i.e., be a photothermal conversion material, typically the photothermal conversion material is a separate compound.

The imaging radiation absorber may be either a dye or pigment, such as a dye or pigment of the squarylium, merocyanine, indolizine, pyrylium, or metal dithiolene class. Examples of absorbing pigments are Projet 900, Projet 860 and Projet 830 (all available from the Zeneca Corporation), and carbon black. Dyes, especially dyes with a high extinction coefficient in the range of 750 nm to 1200 nm, are preferred. Absorbing dyes are disclosed in numerous publications, for example, Nagasaka, EP 0,823,327; DeBoer, U.S. Pat. No. 4,973,572; Jandrue, U.S. Pat. No. 5,244,771; and Chapman, U.S. Pat. No. 5,401,618. Examples of useful absorbing dyes include, ADS-830A and ADS-1064 (American Dye Source, Montreal, Canada), EC2117 (FEW, Wolfen, Germany), Cyasorb IR 99 and Cyasorb IR 165 (Glendale Protective Technology), Epolite IV-62B and Epolite III-178 (Epoline), PINA-780 (Allied Signal), SpectraIR 830A, SpectraIR 840A (Spectra Colors), and IR Dye A, IR Dye B, and IR Dye C.

IR Dye A

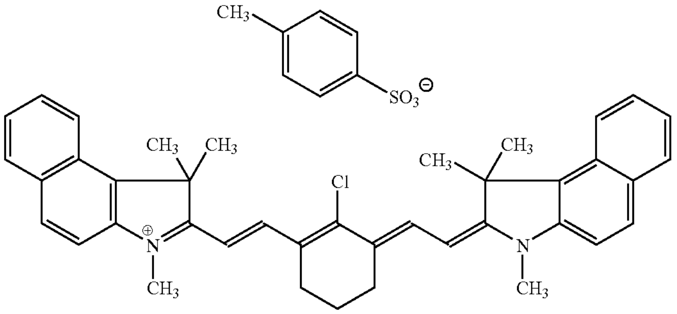

IR Dye B

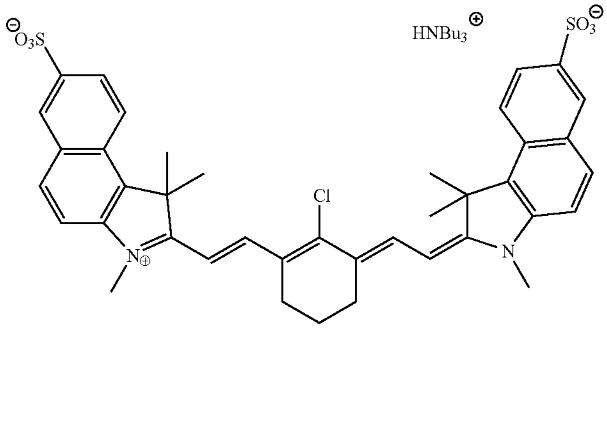

-continued

IR Dye C

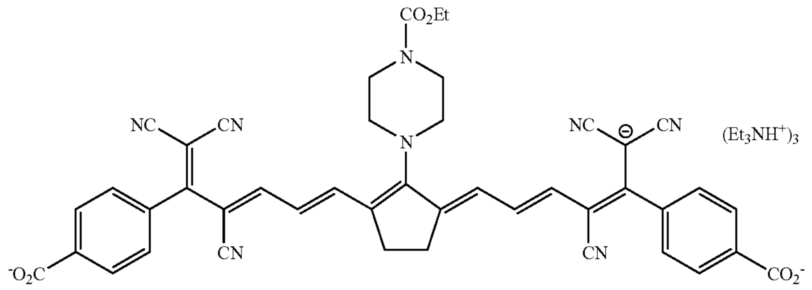

The amount of photothermal conversion material in the element is generally sufficient to provide an optical density of at least 0.05, and preferably, an optical density of from about 0.5 to about 2 at the imaging wavelength. As is well known to those skilled in the art, the amount of an absorber required to produce a particular optical density can be determined from the thickness of the layer and the extinction coefficient of the absorber at the wavelength used for imaging using Beer's law.

Negative Working Imageable Compositions

Negative working imageable compositions may comprise a photothermal conversion material; an acid generator; an acid activatable crosslinking agent; and a polymeric binder. Other ingredients that are conventional ingredients of negative working imageable compositions may also be present. These compositions are disclosed, for example, in Haley, U.S. Pat. No. 5,372,907; Nguyen, U.S. Pat. No. 5,919,601; Kobayashi, U.S. Pat. No. 5,965,319; and Busman, U.S. Pat. No. 5,763,134, the disclosures of which are all incorporated herein by reference.

Acid generators are precursors that form a Brönsted acid by thermally initiated decomposition. Non-ionic acid generators include, for example, haloalkyl-substituted s-triazines, which are described, for example, in Smith, U.S. Pat. No. 3,779,778. Haloalkyl-substituted s-triazines are s-triazines substituted with 1 to 3 $CX_3$ groups in which is X is bromo or, preferably, chloro. Examples include 2-phenyl-4,6-bis(trichloromethyl)-s-triazine, 2,4,6-tris(trichloromethyl)-s-triazine, 2-methyl-4,6-bis(trichloromethyl)-s-triazine, 2-styryl-4,6-bis(trichloromethyl)-s-triazine, 2-(p-methoxystyryl)-4,6-bis(trichloromethyl)-s-triazine, 2-(4-methoxy-naphtho-1-yl)-4,6-bis-trichloromethyl-s-triazine, 2-(4-ethoxy-naphtho-1-yl)-4,6-bis-trichloromethyl-s-triazine, and 2-[4-(2-ethoxyethyl)-naphtho-1-yl]-4,6-bis-trichloromethyl-s-triazine).

Ionic acid generators include, for example, onium salts in which the onium cation is iodonium, sulphonium, phosphonium, oxysulphoxonium, oxysulphonium, sulphoxonium, ammonium, diazonium, selenonium, or arsonium, and the anion is a non-nucleophilic anion such as tetra-fluoroborate, hexafluorophosphate, hexafluoroarsenate, hexafluoroantimonate, triflate, tetrakis(pentafluoro-phenyl)borate, pentafluoroethyl sulfonate, p-methyl-benzyl sulfonate, ethyl sulfonate, trifluoromethyl acetate, and pentafluoroethyl acetate. Typical onium salts include, for example, diphenyl iodonium chloride, diphenyl iodonium hexafluorophosphate, diphenyl iodonium hexafluoroantimonate, 4,4'-dicumyl iodonium chloride, 4,4'-dicumyl iodonium hexofluorophosphate, N-methoxy-α-picolinium-p-toluene sulfonate, 4-methoxybenzene-diazonium tetrafluoroborate, 4,4'-bis-dodecylphenyl iodonium-hexafluoro phosphate, 2-cyanoethyl-triphenylphosphonium chloride, bis-[4-diphenylsulfoniophenyl]sulfide-bis-hexafluoro phosphate, bis-4-dodecylphenyliodonium hexafluoroantimonate, triphenyl sulfonium hexafluoroantimonate, triphenyl sulfonium tetrafluoroborate, 2-methoxy-4-aminophenyl diazonium hexafluorophosphate, phenoxyphenyl diazonium hexafluoroantimonate, and anilinophenyl diazonium hexafluoroantimonate.

Useful ionic acid generators include iodonium, sulfonium, and diazonium salts in which the anion is an organic sulfate or thiosulfate, such as, for example, methyl sulfate or thiosulfate, ethyl sulfate or thiosulfate, hexyl sulfate or thiosulfate, octyl sulfate or thiosulfate, decyl sulfate or thiosulfate, dodecyl sulfate and thiosulfate, trifluoromethyl sulfate or thiosulfate, benzyl sulfate or thiosulfate, pentafluorophenyl sulfate and thiosulfate. Typical acid generators include, for example, diphenyl iodonium octyl sulfate, diphenyl iodonium octyl thiosulfate, triphenyl sulfonium octyl sulfate, 4,4'-dicumyl iodonium p-tolyl sulfate, 2-methoxy-4-(phenylamino)-benzenediazonium octyl sulfate, 2-methoxy-4-(phenylamino)-benzenediazonium hexadecyl sulfate, 2-methoxy-4-(phenylamino)-benzenediazonium dodecyl sulfate, and 2-methoxy-4-(phenylamino)-benzenediazonium vinyl benzyl thiosulfate. These acid generators can be prepared by mixing an onium salt, such as an onium chloride, bromide, or bisulfate, containing the desired cation with a sodium or potassium salt containing the desired anion, i.e., the desired alkyl or aryl sulfate or thiosulfate, either in water or in an aqueous solvent including a hydrophilic solvent such as an alcohol.

Acid-activatable crosslinking agents may comprise at least two acid-activatable reactive groups, such as the hydroxymethyl group, the alkoxymethyl group, the epoxy group, and the vinyl ether group, bonded to an aromatic ring. Examples include methylol melamine resins, resole resins, epoxidized novolac resins, and urea resins. Other examples are amino resins having at least two alkoxymethyl groups (e.g. alkoxymethylated melamine resins, alkoxymethylated glycolurils and alkoxymethylated benzoguanamines). Phenol derivatives comprising at least two groups such as the hydroxymethyl group and/or the alkoxymethyl group provide good fastness in an image portion when an image is formed. Examples of phenol derivatives include resole resins. Resole resins include, for example, GP649D99 resole (Georgia Pacific) and BKS-5928 resole resin (Union Carbide).

Novolac resins are typically prepared by condensation of a phenol, such as phenol, m-cresol, o-cresol, p-cresol, etc, with an aldehyde, such as formaldehyde, paraformaldehyde, acetaldehyde, etc. or a ketone, such as acetone, in the presence of an acid catalyst. One of two processes, the solvent condensation process and the hot melt condensation process, is typically used. The weight average molecular weight is typically about 1,000 to 15,000. Particularly useful novolac resins are prepared by reacting m-cresol, mixtures of m-cresol and p-cresol, or phenol with formaldehyde using conventional conditions.

Resole resins are obtained by reaction of phenolic compounds with aldehydes, but under different reaction conditions than those that produce novolac resins. A typical example of a resole resin useful with novolac resins is the resole resin prepared from bis-phenol A and formaldehyde.

The acid activatable crosslinking agent used in the composition may depend on the polymeric binder. Any combination of acid activatable crosslinking agent and polymeric binder that react to from a crosslinked binder under the imaging conditions may be used. Various combinations of polymeric binder and acid activatable crosslinking agent are known. In general, the binder is a polymer, or mixture of polymers, capable of undergoing an acid-catalyzed condensation reaction with the crosslinking agent when the element is heated to 60–220° C. Typically, an imageable element in which the imageable composition comprises a polymer, an acid generator, and an acid activatable crosslinking agent is heated to about 110° C. to 150° C. after imaging but before processing.

For example, Haley, U.S. Pat. No. 5,372,907, discloses a radiation-sensitive composition that is sensitive to both ultraviolet/visible and infrared radiation. The composition comprises a resole resin and a novolac resin. In these compositions, the novolac resin is the polymeric binder and the resole resin is the acid-activatable crosslinking agent. Nguyen, U.S. Pat. No. 5,919,601, discloses radiation-sensitive compositions imageable by infrared and ultraviolet/visible radiation. These compositions comprise a polymeric binder containing reactive pendant groups selected from hydroxy, carboxylic acid, sulfonamide, and alkoxymethylamides; and a resole resin, a $C_1$–$C_5$ alkoxymethyl melamine or glycoluril resin, a poly($C_1$–$C_5$-alkoxy-methylstyrene), a poly($C_1$–$C_5$-alkoxymethylacrylamide), a derivative thereof, or a combination thereof. Preferably, the crosslinking resin is a resole resin prepared from a $C_1$–$C_5$ alkylphenol and formaldehyde; a tetra $C_1$–$C_5$-alkoxymethyl glycoluril; a polymer of (4-methoxymethylstyrene); a polymer of (N-methoxymethyl) acrylamide; a polymer of (N-i-butoxymethyl)acrylamide; or a butylated phenolic resin. Kobayashi, U.S. Pat. No. 5,965,319, discloses a negative working recording material comprising an acid activatable crosslinking agent, preferably having at least two hydroxymethyl or alkoxymethyl groups bonded to a benzene ring and a polymer compound having an alkaline-soluble group such as a novolac resin. Typical crosslinking agents are phenols containing hydroxymethyl groups, prepared by condensation of phenols with formaldehyde. Busman, U.S. Pat. No. 5,763,134, discloses activatable crosslinking agents, such as 1,3,5-trihydroxymethylbenzene, 1,3,5-triacetoxymethylbenzene, and 1,2,4,5-tetraacetoxymehylbenzene. Other polymeric binders and acid activatable crosslinking agents will be apparent to those skilled in the art.

The imageable composition may also comprise other ingredients such as dyes and surfactants that are conventional ingredients of imageable compositions. Surfactants may be present in the imageable composition as, for example, coating aids. A dye may be present to aid in the visual inspection of the exposed and/or developed element. Printout dyes distinguish the exposed regions from the unexposed regions during processing. Contrast dyes distinguish the unimaged regions from the imaged regions in the developed imageable element. Preferably the dye does not absorb the imaging radiation. Triarylmethane dyes, such as ethyl violet, crystal violet, malachite green, brilliant green, Victoria blue B, Victoria blue R, and Victoria pure blue BO, may act as a contrast dye.

These compositions typically comprise about 0.1 to 10% by weight, more preferably about 0.5 to 10% by weight of the photothermal conversion material based on the total weight of the composition. The imageable composition typically comprises about 0.01 to 50% by weight, preferably about 0.1 to 25% by weight, and more preferably about 0.5 to 20% by weight of the acid generator, based on the total weight of the composition. The imageable composition typically comprises about 5 to 70% by weight, and preferably about 10 to 65% by weight of the cross linking agent based on the total weight of the composition. The imageable composition typically comprises about 10 to 90% by weight, preferably about 20 to 85% by weight, and more preferably about 30 to 80% by weight of the polymer based on the total weight of the composition.

Negative working compositions based on photopolymerization (i.e., photopolymerizable compositions) are described, for example, in *Photoreactive Polymers: the Science and Technology of Resists*, A. Reiser, Wiley, New York, 1989, pp. 102–177; "Photopolymers: Radiation Curable Imaging Systems," by B. M. Monroe, in *Radiation Curing: Science and Technology*, S. P. Pappas, Ed., Plenum, New York, 1992, pp. 399–440; and "Polymer Imaging" by A. B. Cohen and P. Walker, in *Imaging Processes and Materials*, J. M. Sturge, et al., Eds, Van Nostrand Reinhold, New York, 1989, pp. 226–262. These compositions comprise at least one ethylenically unsaturated compound that undergoes free-radical initiated polymerization, generally known as a monomer, a binder, and a free radical generating system. Typical compositions are, by weight, binder(s) 25 to 90%, preferably 45 to 75%; monomer(s), 5 to 60%, preferably, 15 to 50%; photoinitiator system, 0.01 to 10%, preferably 0.1 to 5%; and other ingredients, 0 to 5%, typically 0 to 4%.

The monomers are typically multifunctional, i.e., they comprise more than one ethylenically unsaturated, free radical polymerizable group. Typical multifunctional monomers are unsaturated esters of alcohols, preferably acrylate and methacrylate esters of polyols. Oligomers and/or prepolymers, such as urethane acrylate and methacrylate, epoxide acrylate and methacrylate, polyester acrylate and methacrylate, polyether acrylate and methacrylate or unsaturated polyester resins, may also be used. Numerous other unsaturated monomers polymerizable by free-radical initiated polymerization and useful in photopolymerizable compositions are known to those skilled in the art.

The composition comprises at least one preformed macromolecular polymeric material know as a binder. Representative binders are poly(methyl methacrylate) and copolymers of methyl methacrylate with other alkyl acrylates such as ethyl acrylate, alkyl methacrylates such as ethyl methacrylate, methacrylic acid, and/or acrylic acid. Numerous other binders useful in photopolymerizable compositions are known to those skilled in the art.

A free radical generating, initiating system activatable by ultraviolet, visible radiation or infrared radiation, known as a photoinitiating system, is present to facilitate polymerization of the polymerizable monomers. The photoinitiating system may be a single compound or a mixture of compounds. Suitable photoinitiating systems are disclosed in "Photoinitiators for Free-Radical-Initiated Photoimaging Systems," by B. M. Monroe and G. C. Weed, *Chem. Rev.*, 93, 435–448 (1993) and in "Free Radical Polymerization" by K. K. Dietliker, in *Chemistry and Technology of UV and EB Formulation for Coatings, Inks, and Paints*, P. K. T. Oldring, Ed, SITA Technology Ltd., London, 1991, Vol. 3, pp. 59–525. Typical free radical photoinitiating compounds include Michlers ketone/benzophenone; benzophenone; 2-hydroxy-2-methyl-1-phenylpropan-1-one; 2,4,6-trimethylbenzoyl-diphenylphosphine oxide; 2-isopropylthioxanthone; 2-chlorothioxanthone; 2,2-dimethoxy-2-phenyl-acetophenone; 2-methyl-1-[4-(methylthio)phenyl]-2-morpholinopropanone-1; 1-hydroxycyclohexylphenyl ketone; bis(2,6-dimethoxybenzolyl)-2,4,4-trimethyl-pentylphosphine oxide; and combinations thereof.

Negative working systems also include photocrosslinkable systems, which typically comprise at least one binder and a photoactivated at least bifunctional crosslinking agent that crosslinks the binder on irradiation. Organic azides have been used to crosslink binders. Diazido compounds, such as the disulfonated derivative of 4,4'-diazidostilbene, are preferred azides for photocrosslinking.

Positive Working Photoimageable Systems

Imageable elements that comprise a layer of imageable composition over a substrate are well known to those skilled in the art and are described, for example, in Shimazu, U.S. Pat. No. 6,294,311; Parsons, U.S. Pat. No. 6,280,899; Patel, U.S. Pat. No. 6,352,811; Shimazu, U.S. Pat. No. 6,352,812; Savariar-Hauck, U.S. Pat. No. 6,358,669; and Jarek, U.S. Pat. No. 6,475,692; the disclosures of which are incorporated herein by reference.

Positive-working photoimageable elements are well known. They are described, for example, in Chapter 5 of *Photoreactive Polymers: the Science and Technology of Resists*, A. Reiser, Wiley, New York, 1989, pp. 1780–225. The imageable layer comprises a photosensitive composition that comprises a water insoluble, alkali soluble binder, as well as a material that comprises a photosensitive moiety. The photosensitive moiety may be bonded to the binder and/or it may be in a separate compound.

The photosensitive moiety is typically the o-benzoquinonediazide moiety or the o-diazonaphthoquinone moiety. Compounds that contain the o-diazonaphthoquinone moiety (i.e., quinonediazides), preferably compounds that comprise an o-diazonaphthoquinone moiety attached to a ballasting moiety that has a molecular weight of at least 1500, but less than about 5000, are preferred. Typically, these compounds are prepared by the reaction of a 1,2-naphthoquinone diazide having a halogenosulfonyl group, typically a sulfonylchloride group, at the 4- or 5-position with a mono- or poly-hydroxyphenyl compound, such as mono- or poly-hydroxy benzophenone.

Useful compounds include, but are not limited to: 2,4-bis(2-diazo-1,2-dihydro-1-oxo-5-naphthalenesulfonyloxy)benzophenone; 2-diazo-1,2-dihydro-1-oxo-5-naphthalenesulfonyloxy-2,2-bishydroxyphenylpropane monoester; the hexahydroxybenzophenone hexaester of 2-diazo-1,2-dihydro-1-oxo-5-naphthalenesulfonic acid; 2,2'-bis(2-diazo-1,2-dihydro-1-oxo-5-naphthalenesulfonyloxy)biphenyl; 2,2',4,4'-tetrakis(2-diazo-1,2-dihydro-1-oxo-5-naphthalenesulfonyloxy)biphenyl; 2,3,4-tris(2-diazo-1,2-dihydro-1-oxo-5-naphthalenesulfonyloxy)benzophenone; 2,4-bis(2-diazo-1,2-dihydro-1-oxo-4-naphthalenesulfonyloxy)benzophenone; 2-diazo-1,2-dihydro-1-oxo-4-naphthalenesulfonyloxy-2,2-bishydroxyphenylpropane monoester; the hexahydroxybenzophenone hexaester of 2-diazo-1,2-dihydro-1-oxo-4-naphthalenesulfonic acid; 2,2'-bis(2-diazo-1,2-dihydro-1-oxo-4-naphthalenesulfonyloxy)biphenyl; 2,2',4,4'-tetrakis(2-diazo-1,2-dihydro-1-oxo-4-naphthalenesulfonyloxy)biphenyl; 2,3,4-tris(2-diazo-1,2-dihydro-1-oxo-4-naphthalenesulfonyloxy)benzophenone; and others known in the art, for example, those described in Mizutani, U.S. Pat. No. 5,143,816.

Alternatively, or additionally, the imageable layer may comprise a polymeric diazonaphthoquinone compound. Polymeric diazonaphthoquinone compounds include derivatized resins formed by the reaction of a reactive derivative that contains a diazonaphthoquinone moiety and a polymeric material that contains a suitable reactive group, such as a hydroxyl or amino group. Suitable polymeric materials for forming these derivatized resins include the novolac resins, resole resins, polyvinyl phenols, acrylate and methacrylate copolymers of hydroxy-containing monomers such as hydroxystyrene. Representative reactive derivatives include sulfonic and carboxylic acid, ester, or amide derivatives of the diazonaphthoquinone moiety. Derivatization of phenolic resins with compounds that contain the diazonaphthoquinone moiety is well known in the art and is described, for example, in West, U.S. Pat. Nos. 5,705,308, and 5,705,322. An example of a polymer derivatized with a compound that comprises a diazonaphthoquinone moiety is P-3000, a naphthoquinone diazide of a pyrogallol/acetone resin (available from PCAS, Longjumeau, France). They can be used alone in the imageable layer, or they can be combined with other polymeric materials and/or dissolution inhibitors.

In the positive working photoimageable elements, the binder is a light-stable, water-insoluble, aqueous alkaline developer soluble or removable, film-forming polymeric material that has a multiplicity of carboxyl, carboxylic acid anhydride, or phenolic hydroxyl groups, preferably phenolic hydroxyl groups, either on the polymer backbone or on pendant groups. These groups impart aqueous alkaline developer solubility to the imageable layer. Novolac resins, resole resins, acrylic resins that contain pendent phenol groups, and polyvinyl phenol resins are preferred phenolic resins.

Novolac resins, described above, are more preferred. The novolac resin is preferably solvent soluble, that is, preferably sufficiently soluble in a coating solvent to produce a coating solution that can be coated to produce a imageable layer. Common coating solvents include, for example, acetone, tetrahydrofuran, and 1-methoxypropan-2-ol. In one aspect, the novolac resin is a solvent soluble novolac resin having a weight average molecular weight of at least 10,000; a solvent soluble novolac resin having a weight average molecular weight of at least 10,000, functionalized with polar groups; a solvent soluble m-cresol/p-cresol novolac resin that comprises at least 10 mol % p-cresol and has a weight average molecular weight of at least 8,000; a solvent soluble m-cresol/p-cresol novolac resin that comprises at least 10 mol % p-cresol and has a weight average molecular weight of at least 8,000, functionalized with groups that contain the o-benzoquinonediazide or o-diazonaphthoquinone moiety; or a mixture thereof. In one aspect, the novolac resin is prepared by solvent condensation.

Other phenolic resins useful as the binder include polyvinyl compounds having phenolic hydroxyl groups. Such compounds include, for example, polyhydroxystyrenes and copolymers containing recurring units of a hydroxystyrene, and polymers and copolymers containing recurring units of substituted hydroxystyrenes. The coating weight of the imageable layer is typically about 0.5 to 5 g/$m^2$.

Positive working thermally imageable elements in which the imageable element comprises a polymeric material and a dissolution inhibitor are known. The polymeric material is a water insoluble and alkali soluble binder, such as is discussed above, typically a phenolic resin, such as a novolac resin. The dissolution inhibitors are believed not to be photoreactive to radiation in the range of about 600 nm to about 800 nm or to radiation in the range of about 800 nm to about 1200 nm, the ranges of radiation typically used for imaging thermally imageable elements. The element typically comprises an underlayer between the imageable layer and the substrate. Such systems are disclosed in, for example, Parsons, U.S. Pat. No. 6,280,899; Shimazu, U.S. Pat. No. 6,294,311, and U.S. Pat. No. 6,352,812; and Savariar-Hauck, U.S. Pat. No. 6,358,669.

Useful polar groups for dissolution inhibitors include, for example, diazo groups; diazonium groups; keto groups; sulfonic acid ester groups; phosphate ester groups; triarylmethane groups; onium groups, such as sulfonium, iodonium, and phosphonium; groups in which a nitrogen atom is incorporated into a heterocyclic ring; and groups that contain a positively charged atom, especially a positively charged nitrogen atom, typically a quaternized nitrogen atom, i.e., ammonium groups. Compounds that contain a positively charged (i.e., quaternized) nitrogen atom useful as dissolution inhibitors include, for example, tetraalkyl ammonium compounds, quinolinium compounds, benzothiazolium compounds, pyridinium compounds, and imidazolium compounds. Compounds containing other polar groups, such as ether, amine, azo, nitro, ferrocenium, sulfoxide, sulfone, and disulfone may also be useful as dissolution inhibitors.

Quaternized heterocyclic compounds are useful as dissolution inhibitors. Representative imidazolium compounds include Monazoline C (cocoate imidazoline), Monazoline O (oleic imidazoline), and Monazoline T (tall oil imidazoline) (Uniqema, Wilmington, Del., USA). Representative quinolinium dissolution inhibitors include 1-ethyl-2-methyl quinolinium iodide, 1-ethyl-4-methyl quinolinium iodide and cyanine dyes that comprise a quinolinium moiety such as Quinoldine Blue. Representative benzothiazolium compounds include 3-ethyl-2(3H)-benzothiazolylidene-2-methyl-1-(propenyl)benzothiazolium cationic dyes and 3-ethyl-2-methylbenzothiazolium iodide. Suitable pyridinium dissolution inhibitors include cetyl pyridinium bromide and ethyl viologen dications. Diazonium salts are useful as dissolution inhibitors and include, for example, substituted and unsubstituted diphenylamine diazonium salts, such as methoxy-substituted diphenylamine diazonium hexafluoroborates.

A preferred group of dissolution inhibitors are triarylmethane dyes, such as ethyl violet, crystal violet, malachite green, brilliant green, Victoria blue B, Victoria blue R, and Victoria blue BO. These compounds can also act as contrast dyes, which distinguish the unimaged regions from the imaged regions in the developed imageable element. The dissolution inhibitor may be a monomeric and/or polymeric compound that comprises o-benzoquinonediazide moiety and/or an o-diazonaphthoquinone moiety, such as is discussed above. When a dissolution inhibitor is present in the imageable layer, its amount can vary widely, but generally it is at least about 0.1 wt %, typically about 0.5 wt % to about 30 wt %, preferably about 1 wt % to 15 wt %, based on the total dry composition weight of the layer.

Alternatively, or additionally, the polymeric material in the imageable layer can comprise polar groups that act as acceptor sites for hydrogen bonding with the hydroxy groups present in the polymeric material and, thus, act as a both the polymeric material and dissolution inhibitor. Derivatization of the hydroxyl groups of the polymeric material increases its molecular weight and reduces the number of hydroxyl groups, typically reducing both the solubility and the rate of dissolution of the polymeric material in the developer. Although it is important that the level of derivatization be high enough that the polymeric material acts as a dissolution inhibitor, it should not be so high that, following thermal imaging, the polymeric material is not soluble in the developer. As described above, derivatization of phenolic resins with compounds that contain the diazonaphthoquinone moiety is well known. Although the degree of derivatization required will depend on the nature of the polymeric material and the nature of the moiety containing the polar groups introduced into the polymeric material, typically about 0.5 mol % to about 5 mol %, preferably about 1 mol % to about 3 mol %, of the hydroxyl groups will be derivatized. These derivatized polymeric materials can act as both the polymeric material and a dissolution inhibitor. They can be used alone in the imageable layer, or they can be combined with other polymeric materials and/or dissolution inhibitors.

One group of polymeric materials that comprise polar groups and function as dissolution inhibitors are derivatized phenolic polymeric materials in which a portion of the phenolic hydroxyl groups have been converted to sulfonic acid esters, preferably phenyl sulfonates or p-toluene sulfonates. Derivatization can be carried out by reaction of the polymeric material with, for example, a sulfonyl chloride such as p-toluene sulfonyl chloride in the presence of a base such as a tertiary amine. A preferred polymeric material is a derivatized novolac resin in which about 1 mol % to 3 mol %, preferably about 1.5 mol % to about 2.5 mol %, of the hydroxyl groups have been converted to phenyl sulfonate or p-toluene sulfonate (tosyl) groups.

It will be appreciated by those skilled in the art that although phenolic polymers which have been derivatized with polar groups (e.g., polymers in which some of the hydroxyl groups have been derivatized with sulfonic acid ester groups or with groups that contain the o-benzoquinonediazide moiety and/or the diazonaphthoquinone moiety) are soluble in aqueous alkaline developer, a layer comprising or consisting essentially of one or more of these materials is “insoluble” in aqueous alkaline developer. This is because solubility and insolubility of the layer are determined by the relative rates at which the imaged and unimaged regions of the layer are removed by the developer. Following imagewise thermal exposure of a layer comprising or consisting essentially of one or more of these derivatized phenolic polymeric materials, the exposed regions of the layer are removed by the aqueous alkaline developer more rapidly than the unexposed regions. If the development step is carried out for an appropriate time, the exposed regions are removed and the unexposed regions remain, so that an image made up of the unexposed regions is formed. Hence the exposed regions are “removable” or “soluble” in the aqueous developer and the unexposed regions are “not removable” or “insoluble” in the aqueous alkaline developer.

When the imageable element comprises an underlayer, the polymeric material in the underlayer is preferably soluble in an alkaline developer. In addition, this polymeric material is preferably insoluble in the solvent used to coat the imageable layer so that the imageable layer can be coated over the underlayer without dissolving the underlayer.

Polymeric materials useful the underlayer include those that contain an acid and/or phenolic functionality, and mixtures of such materials. Useful polymeric materials include carboxy functional acrylics, vinyl acetate/crotonate/vinyl neodecanoate copolymers, styrene maleic anhydride copolymers, phenolic resins, maleated wood rosin, and combinations thereof. Underlayers that provide resistance both to fountain solution and aggressive washes are disclosed in Shimazu, U.S. Pat. No. 6,294,311, incorporated herein by reference.

Particularly useful polymeric materials are copolymers that comprise N-substituted maleimides, especially N-phenylmaleimide; polyvinylacetals; methacrylamides, especially methacrylamide; and acrylic and/or methacrylic acid, especially methacrylic acid. More preferably, two functional groups are present in the polymeric material, and most preferably, all three functional groups are present in the polymeric material. The preferred polymeric materials of this type are copolymers of N-phenylmaleimide, methacrylamide, and methacrylic acid, more preferably those that contain about 25 to about 75 mol %, preferably about 35 to about 60 mol % of N-phenylmaleimide; about 10 to about 50 mol %, preferably about 15 to about 40 mol % of methacrylamide; and about 5 to about 30 mol %, preferably about 10 to about 30 mol %, of methacrylic acid. Other hydrophilic monomers, such as hydroxyethyl methacrylate, may be used in place of some or all of the methacrylamide. Other alkaline soluble monomers, such as acrylic acid, may be used in place of some or all of the methacrylic acid.

These polymeric materials are soluble in alkaline developers. In addition, they are soluble in a methyl lactate/methanol/dioxolane (15:42.5:42.5 wt %) mixture, which can be used as the coating solvent for the underlayer. However, they are poorly soluble in solvents such as acetone and toluene, which can be used as solvents to coat the imageable layer on top of the underlayer without dissolving the underlayer.

Another group of preferred polymeric materials for the polymeric material in the underlayer are alkaline developer soluble copolymers that comprise a monomer that has a urea bond in its side chain (i.e., a pendent urea group), such as are disclosed in Ishizuka, U.S. Pat. No. 5,731,127. These copolymers comprise about 10 to 80 wt %, preferably about 20 to 80 wt %, of one or more monomers represented by the general formula:

$$CH_2{=}C(R){-}CO_2{-}X{-}NH{-}CO{-}NH{-}Y{-}Z,$$

in which R is $-H$ or $-CH_3$; X is a bivalent linking group; Y is a substituted or unsubstituted bivalent aromatic group; and Z is $-OH$, $-COOH$, or $-SO_2NH_2$.

R is preferably $-CH_3$. Preferably X is a substituted or unsubstituted alkylene group, substituted or unsubstituted phenylene [$-(C_6H_4)-$] group, or substituted or unsubstituted naphthalene [$-(C_{10}H_6)-$] group; such as $-(CH_2)_n-$, in which n is 2 to 8; 1,2-, 1,3-, and 1,4-phenylene; and 1,4-, 2,7-, and 1,8-naphthalene. More preferably X is unsubstituted and even more preferably n is 2 or 3; most preferably X is $-(CH_2CH_2)-$. Preferably Y is a substituted or unsubstituted phenylene group or substituted or unsubstituted naphthalene group; such as 1,2-, 1,3-, and 1,4-phenylene; and 1,4-, 2,7-, and 1,8-naphthalene. More preferably Y is unsubstituted, most preferably unsubstituted 1,4-phenylene. Z is $-OH$, $-COOH$, or $-SO_2NH_2$, preferably $-OH$. A preferred monomer is:

$$CH_2{=}C(CH_3){-}CO_2{-}CH_2CH_2{-}NH{-}CO{-}NH\text{-}p\text{-}C_6H_4\text{-}Z,$$

in which Z is $-OH$, $-COOH$, or $-SO_2NH_2$, preferably $-OH$.

In the synthesis of a copolymer, one or more of the urea group containing monomers may be used. The copolymers also comprise 20 to 90 wt % other polymerizable monomers, such as maleimide, acrylic acid, methacrylic acid, acrylic esters, methacrylic esters, acrylonitrile, methacrylonitrile, acrylamides, and methacrylamides. A copolymer that comprises in excess of 60 mol % and not more than 90 mol % of acrylonitrile and/or methacrylonitrile in addition to acrylamide and/or methacrylamide provides superior physical properties. More preferably the alkaline soluble copolymers comprise 30 to 70 wt % urea group containing monomer; 20 to 60 wt % acrylonitrile or methacrylonitrile, preferably acrylonitrile; and 5 to 25 wt % acrylamide or methacrylamide, preferably methacrylamide.

The polymeric materials described above are soluble in alkaline developers. In addition, they are soluble in polar solvents, such as ethylene glycol monomethyl ether, which can be used as the coating solvent for the underlayer. However, they are poorly soluble in less polar solvents, such as 2-butanone (methyl ethyl ketone), which can be used as a solvent to coat the imageable layer over the underlayer without dissolving the underlayer.

Both these groups of polymeric materials can be prepared by methods, such as free radical polymerization, well known to those skilled in the art. Synthesis of copolymers that have urea bonds in their side chains is disclosed, for example, in Ishizuka, U.S. Pat. No. 5,731,127.

Another group of polymeric materials that are useful in the underlayer include alkaline developer soluble copolymers that comprise about 10 to 90 mol % of a sulfonamide monomer unit, especially those that comprise N-(p-aminosulfonylphenyl)methacrylamide, N-(m-aminosulfonylphenyl)-methacrylamide, N-(o-aminosulfonylphenyl)methacrylamide, and/or the corresponding acrylamide. Useful alkaline developer soluble polymeric materials that comprise a pendent sulfonamide group, their method of preparation, and monomers useful for their preparation, are disclosed in Aoshima, U.S. Pat. No. 5,141,838. Particularly useful polymeric materials comprise (1) the sulfonamide monomer unit, especially N-(p-aminosulfonylphenyl)methacrylamide; (2) acrylonitrile and/or methacrylonitrile; and (3) methyl methacrylate and/or methyl acrylate.

Other alkaline developer soluble polymeric materials may be useful in the underlayer. Derivatives of methyl vinyl ether/maleic anhydride copolymers that contain an N-substituted cyclic imide moiety and derivatives of styrene/maleic anhydride copolymers that contain an N-substituted cyclic imide moiety may be useful if they have the required solubility characteristics. These copolymers can be prepared by reaction of the maleic anhydride copolymer with an amine, such as p-aminobenzenesulfonamide, or p-aminophenol, followed by ring closure by acid.

Substrate

The substrate comprises a support, which may be any material conventionally used to prepare imageable elements useful as lithographic printing plates. The support is preferably strong, stable and flexible. It should resist dimensional change under conditions of use so that color records will register in a full-color image. Typically, it can be any self-supporting material, including, for example, polymeric films such as polyethylene terephthalate film, ceramics, metals, or stiff papers, or a lamination of any of these materials. Metal supports include aluminum, zinc, titanium, and alloys thereof.

Typically, polymeric films contain a sub-coating on one or both surfaces to modify the surface characteristics to enhance the hydrophilicity of the surface, to improve adhesion to subsequent layers, to improve planarity of paper substrates, and the like. The nature of this layer or layers depends upon the substrate and the composition of subsequent coated layers. Examples of subbing layer materials are adhesion-promoting materials, such as alkoxysilanes, amino-propyltriethoxysilane, glycidoxypropyltriethoxysilane and epoxy functional polymers, as well as conventional subbing materials used on polyester bases in photographic films.

The surface of an aluminum support may be treated by techniques known in the art, including physical graining, electrochemical graining, chemical graining, and anodizing. The substrate should be of sufficient thickness to sustain the wear from printing and be thin enough to wrap around a printing form, typically from about 100 to about 600 μm. Typically, the substrate comprises an interlayer between the aluminum support and the imageable layer. The interlayer may be formed by treatment of the support with, for example, silicate, dextrin, hexafluorosilicic acid, phosphate/fluoride, polyvinyl phosphonic acid (PVPA) or vinyl phosphonic acid copolymers.

The back side of the substrate (i.e., the side opposite the underlayer and imageable layer) may be coated with an antistatic agent and/or a slipping layer or matte layer to improve handling and "feel" of the imageable element.

Other Layers

Other layers may be present in the imageable elements. When present, an absorber layer is between the imageable layer and the underlayer. The absorber layer consists essentially of the photothermal conversion material or a mixture of photothermal conversion materials and, optionally, a surfactant, such as a polyethoxylated dimethylpolysiloxane copolymer, or a mixture of surfactants. In particular, the absorber layer is substantially free of the polymeric material in the underlayer. The surfactant may be present to help disperse the photothermal conversion material in a coating solvent.

The thickness of the absorber layer is generally sufficient to absorb at least 90%, preferably at least 99%, of the imaging radiation. The amount of photothermal conversion material required to absorb a particular amount of radiation can be determined from the thickness of the layer and the extinction coefficient of the photothermal conversion material at the imaging wavelength using Beer's law. Typically, the absorber layer has a coating weight of about 0.02 $g/m^2$ to about 2 $g/m^2$, preferably about 0.05 $g/m^2$ to about 1.5 $g/m^2$.

To minimize migration of the photothermal conversion material from the underlayer to the imageable layer during manufacture and storage of the imageable element, the element may comprise a barrier layer between the underlayer and the imageable layer. The barrier layer comprises a polymeric material that is soluble in the developer. If this polymeric material is different from the polymeric material in the underlayer, it is preferably soluble in at least one organic solvent in which the polymeric material in the underlayer is insoluble. A preferred polymeric material for the barrier layer is polyvinyl alcohol. When the polymeric material in the barrier layer is different from the polymeric material in the underlayer, the barrier layer should be less than about one-fifth as thick as the underlayer, preferably less than a tenth of the thickness of the underlayer.

The polymeric material in the underlayer and the polymeric material in the barrier layer may be the same polymeric material. When the barrier layer and the underlayer comprise the same polymeric material, the barrier layer should be at least half the thickness of the underlayer and more preferably as thick as the underlayer.

Stacks of Imageable Elements

The imageable elements do not stick to each other when the interleaving paper is omitted so that they can readily handled by automatic processing equipment. That is, when the substrate of one imageable element is in direct contact with the imageable layer of the next element in the stack, the elements do not stick to each other. Thus, when a stack of elements is shipped without an interleaving paper between each of the imageable elements, the elements can be used by the customer without the need to release the interleaving paper and without the problems caused by the elements sticking to each other.

A stack comprises at least two imageable elements, typically 2 to about 1000 imageable elements, more typically at least about 20, and even more typically at least about 100 imageable elements. Even more typically, a stack comprises about 200 to about 800 imageable elements. In one aspect, a stack comprises about 400 to about 600 imageable elements, typically about 500 imageable elements. Stacks of thermally imageable elements, especially positive working thermally imageable elements, are especially useful. There is no interleaving paper between the imageable elements in the stack so that the imageable layer of each imageable element in the stack (except for the uppermost element in the stack when the imageable elements are stacked with the imageable layer up) is in direct contact with the substrate of each successive imageable element in the stack.

Preparation of the Imageable Element

The imageable element may be prepared by sequentially applying the underlayer over the hydrophilic surface of the substrate; applying the absorber layer or the barrier layer, if present, over the underlayer; and then applying the imageable layer using conventional techniques.

The terms "solvent" and "coating solvent" include mixtures of solvents. These terms are used although some or all of the materials may be suspended or dispersed in the solvent rather than in solution. Selection of coating solvents depends on the nature of the components present in the various layers.

The underlayer may be applied by any conventional method, such as coating or lamination. Typically the ingredients are dispersed or dissolved in a suitable coating solvent, and the resulting mixture coated by conventional methods, such as spin coating, bar coating, gravure coating, die coating, or roller coating.

The imageable layer is applied to the substrate or, if present, over the underlayer. If an underlayer is present, to prevent these layers from dissolving and mixing, the imageable layer should be coated from a solvent in which the underlayer layer is essentially insoluble. Thus, the coating solvent for the imageable layer should be a solvent in which the components of the imageable layer are sufficiently soluble that the imageable layer can be formed and in which any underlying layers are essentially insoluble. Typically, the solvents used to coat the underlying layers are more polar than the solvent used to coat the imageable layer. An intermediate drying step, i.e., drying the underlayer, if present, to remove coating solvent before coating the imageable layer over it, may also be used to prevent mixing of the layers. Alternatively, the underlayer, the imageable layer or both layers may be applied by conventional extrusion coating methods from a melt mixture of layer components. Typically, such a melt mixture contains no volatile organic solvents.

Imaging and Processing

Direct digital imaging, which obviates the need for exposure through a photomask, may be carried out with, for example, a laser, a thermal head, or a digital light processor. When a laser is used for imaging, a laser that emits radiation that is effective in imaging the imageable element is used. For example, diazonaphthoquinone compounds substituted in the 5-position typically absorb at 345 nm and 400 nm. Diazonaphthoquinone compounds substituted in the 4-position typically absorb at 310 nm and 380 nm.

A digital light processor uses the digital screen imaging process and can be used for direct digital imaging in the range of 360 nm to 450 nm. Ultraviolet radiation is directed onto the imageable element with the aid of a micromechanical, electronically controlled Digital Micromirror Device. Digital light processors include, for example, the UV-Sefter™ 57, 57-F, 710-S, and 116-f processors (basysPrint GmbH, Lüneburg, Germany).

The element may be thermally imaged with a laser or an array of lasers emitting modulated near infrared or infrared radiation in a wavelength region that is absorbed by the imageable element. Infrared radiation, especially infrared radiation in the range of about 800 nm to about 1200 nm, is typically used for imaging. Imaging is conveniently carried out with a laser emitting at about 830 nm, about 1056 nm, or about 1064 nm. Suitable commercially available imaging devices include image setters such as the Creo Trendsetter (CREO, British Columbia, Canada) and the Gerber Crescent 42T (Gerber).

Alternatively, the imageable element may be thermally imaged using a hot body, such as a conventional apparatus containing a thermal printing head. A suitable apparatus includes at least one thermal head but would usually include a thermal head array, such as a TDK Model No. LV5416 used in thermal fax machines and sublimation printers or the GS618-400 thermal plotter (Oyo Instruments, Houston, Tex., USA).

After imaging, the imaged imageable element may be heated. This optional heating step can be carried out by radiation, convection, contact with heated surfaces, for example, with rollers, or by immersion in a heated bath comprising an inert liquid, for example, water. Preferably, the imaged imageable element is heated in an oven.

The heating temperature is typically determined by the fog point of the imageable element. The fog point is defined as the lowest temperature, at a heating time of two minutes, required to render a thermally imageable element non-processable. For negative working elements that comprise an acid generator, the temperature is about 28° C. (about 50° F.) or less below the fog point at a heating time of two minutes, more preferably about 17° C. (about 30° F.) or less below the fog point at a heating time of two minutes and most preferably about 8° C. (15° F.) below the fog point at a heating time of two minutes. Typically the heating temperature is about 110° C. to 150° C. (230° F. to 300° F.). The heating time can vary widely, depending on the method chosen for the application of heat as well as the other steps in the process. If a heat-transferring medium is used, the heating time will preferably be from about 30 seconds to about 30 minutes, more preferably from about 1 minute to about 5 minutes. When the imaged imageable element is heated in an oven, the heating time is preferably from about 1 minute to about 5 minutes.

Imaging produces an imaged element, which comprises a latent image of imaged and unimaged regions. Development of the imaged element to form an image converts the latent image to an image by removing the imaged regions, revealing the hydrophilic surface of the underlying substrate.

The developer penetrates and removes the imaged regions of the imageable layer and of any other layers present in the element without substantially affecting the complimentary unimaged regions. While not being bound by any theory or explanation, it is believed that image discrimination is based on a kinetic effect. The imaged regions of the imageable layer are removed more rapidly in the developer than the unimaged regions. Development is carried out for a long enough time to remove the imaged regions of the imageable layer, the underlying regions of the other layer or layers of the element, but not long enough to remove the unimaged regions of the imageable layer. Hence, the imageable layer is described as being "insoluble" in the developer prior to imaging, and the imaged regions are described as being "soluble" in or "removable" by the developer because they are removed, and dissolved and/or dispersed, more rapidly in the developer than the unimaged regions. Typically, the underlayer is dissolved in the developer and the imageable layer is dispersed in the developer.

Common components of developers are surfactants; chelating agents, such as salts of ethylenediamine tetraacetic acid; organic solvents such as benzyl alcohol and phenoxyethanol; and alkaline components such as inorganic metasilicates, organic metasilicates, hydroxides or bicarbonates. Typical surfactants are: alkali metal salts of alkyl naphthalene sulfonates; alkali metal salts of the sulfate monoesters of aliphatic alcohols, typically having six to nine carbon atoms; and alkali metal sulfonates, typically having six to nine carbon atoms. A developer may also comprise a buffer system to keep the pH relatively constant. Numerous buffer systems are known to those skilled in the art. Typically buffer systems include, for example: combinations of water-soluble amines, such as mono-ethanol amine, diethanol amine, tri-ethanol amine, or tri-iso-propyl amine, with a sulfonic acid, such as benzene sulfonic acid or 4-toluene sulfonic acid; mixtures of the tetra sodium salt of ethylene diamine tetracetic acid (EDTA) and EDTA; mixtures of phosphate salts, such as mixtures of mono-alkali phosphate salts with tri-alkali phosphate salts; and mixtures of alkali borates and boric acid. Water typically comprises the balance of the developer.

High pH developers are typically used for positive working imageable elements, and solvent-based developers are typically used for negative working imageable elements. A high pH developer typically has a pH of at least about 11, more typically at least about 12, preferably from about 12 to about 14.

High pH developers comprise at least one alkali metal silicate, such as lithium silicate, sodium silicate, and/or potassium silicate. Sodium silicate and potassium silicate are preferred, and potassium silicate is most preferred. A mixture of alkali metal silicates may be used if desired. Especially preferred high pH developers comprise an alkali metal silicate having a $SiO_2$ to $M_2O$ weight ratio of at least of at least about 0.3, in which M is the alkali metal. Preferably, the ratio is from about 0.3 to about 1.2. More preferably, it is from about 0.6 to about 1.1, and most preferably, it is from about 0.7 to about 1.0.

The amount of alkali metal silicate in the high pH developer is typically at least 20 g of $SiO_2$ per 1000 g of developer (that is, at least about 2 wt %) and preferably about 20 g to 80 g of $SiO_2$ per 1000 g of developer (that is, about 2 wt % to about 8 wt %). More preferably, it is about 40 g to 65 g of $SiO_2$ per 1000 g of developer (that is, about 4 wt % to about 6.5 wt %).

In addition to the alkali metal silicate, alkalinity can be provided by a suitable concentration of any suitable base, such as, for example, ammonium hydroxide, sodium hydroxide, lithium hydroxide, and/or potassium hydroxide. A preferred base is potassium hydroxide. Optional components of high pH developers are anionic, nonionic and amphoteric surfactants (up to 3% on the total composition weight), biocides (antimicrobial and/or antifungal agents), antifoaming agents or chelating agents (such as alkali gluconates), and thickening agents (water soluble or water dispersible polyhydroxy compounds such as glycerin or polyethylene glycol). However, these developers typically do not contain organic solvents. Typical commercially available high pH developers include: Goldstar™ Developer, 4030 Developer, PD-1 Developer, and MX Developer, all available from Kodak Polychrome Graphics, Norwalk, Conn.

Solvent based alkaline developers comprise an organic solvent or a mixture of organic solvents. The developer is a single phase. Consequently, the organic solvent or mixture of organic solvents must be either miscible with water or sufficiently soluble in the developer that phase separation does not occur. The following solvents and mixtures thereof are suitable for use in the developer: the reaction products of phenol with ethylene oxide and propylene oxide, such as ethylene glycol phenyl ether (phenoxyethanol); benzyl alcohol; esters of ethylene glycol and of propylene glycol with acids having six or fewer carbon atoms, and ethers of ethylene glycol, diethylene glycol, and of propylene glycol with alkyl groups having six or fewer carbon atoms, such as 2-ethoxyethanol and 2-butoxyethanol. A single organic solvent or a mixture of organic solvents can be used. The organic solvent is typically present in the developer at a concentration of between about 0.5 wt % to about 15 wt %, based on the weight of the developer, preferably between about 3 wt % and about 5 wt %, based on the weight of the developer. Typical commercially available solvent based developers include 956 Developer, and 955 Developer, available from Kodak Polychrome Graphics, Norwalk, Conn.

The developer is typically applied to the imaged precursor by spraying the element with sufficient force to remove the imaged regions. Alternatively, development may carried out in a processor equipped with an immersion-type developing bath, a section for rinsing with water, a gumming section, a drying section, and a conductivity-measuring unit, or the imaged precursor may be brushed with the developer. In each instance, a printing plate is produced. Development may conveniently be carried out in a commercially available spray-on processor, such as an 85 NS (Kodak Polychrome Graphics).

Following development, the printing plate is rinsed with water and dried. Drying may be conveniently carried out by infrared radiators or with hot air. After drying, the printing plate may be treated with a gumming solution. A gumming solution comprises one or more water-soluble polymers, for example polyvinylalcohol, polymethacrylic acid, polymethacrylamide, polyhydroxyethyl-methacrylate, polyvinylmethylether, gelatin, and polysaccharide such as dextran, pullulan, cellulose, gum arabic, and alginic acid. A preferred material is gum arabic.

A developed and gummed plate may also be baked to increase the run length of the plate. Baking can be carried out, for example at about 220° C. to about 240° C. for about 7 to 10 minutes, or at a temperature of 120° C. for 30 min.

INDUSTRIAL APPLICABILITY

The imageable elements are especially useful as lithographic printing plate precursors. Once the imageable element has been imaged and processed, printing can then be carried out by applying a fountain solution and then a lithographic ink to the image on its surface. The fountain solution is taken up by the imaged regions, i.e., the surface of the hydrophilic substrate revealed by imaging and development process, and the ink is taken up by the unimaged regions, i.e., the regions of the imageable layer not removed by the development process. The ink is then transferred to a suitable receiving material (such as cloth, paper, metal, glass or plastic) either directly or indirectly with an offset printing blanket to provide a desired impression of the image thereon.

The advantageous properties of this invention can be observed by reference to the following examples, which illustrate but do not limit the invention.

EXAMPLES

In the Examples, "coating solution" refers to the mixture of solvent or solvents and additives coated, although some of the additives may be in suspension rather than in solution. Except where indicated, the indicated percentages are percentages by weight based on the total solids in the coating solution.

| Glossary | |
|---|---|
| Particles A | Silicate-coated 50% methylmethacrylate/50% ethylene glycol dimethacrylate polymer particles; 8 microns |
| Particles B | Silicate-coated 70% styrene/30% divinyl benzene polymer particles; 6 microns |
| m-Cresol novolac resin | Purified N-13 novolac resin; 100% m-cresol; MW 13,000 (Eastman Kodak Rochester, NY, USA) |

-continued

| Glossary | |
|---|---|
| D11 | Ethanaminium, N-[4-[[4-(diethylamino)phenyl][4-(ethylamino)-1-naphthalenyl]methylene]-2,5-cyclohexadien-1-ylidene]-N-ethyl-, salt with 5-benzoyl-4-hydroxy-2-methoxybenzenesulfonic acid (1:1); colorant dye (see structure below), blue dye (PCAS Corp, Longjumeau, France) |
| DC-190 | Silicone surfactant (Dow Corning) |
| IR Dye A | Infrared absorbing compound; IR Dye A ($\lambda_{max}$ = 830 nm); (see structure above) |
| IR Dye D | Infrared absorbing compound (see structure below) |
| METHYL CELLOSOLVE ® | 2-methoxyethanol (Dow, Midland, MI, USA) |
| MB20X-5 | Poly(methyl methacrylate-co-1,4-divinyl benzene; 5 microns (Sekisui Plastics, Osaka, Japan) |
| Resole resin | ZF-7234 (Dainippon Ink and Chemicals, Tokyo, Japan) |
| BX-6 | Cross-linked polystyrene; 6 microns (Sekisui Plastics, Osaka, Japan) |

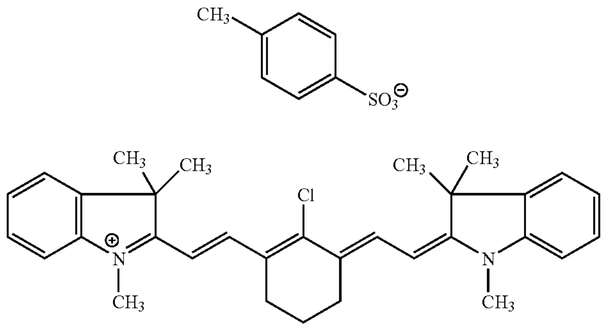

IR Dye D

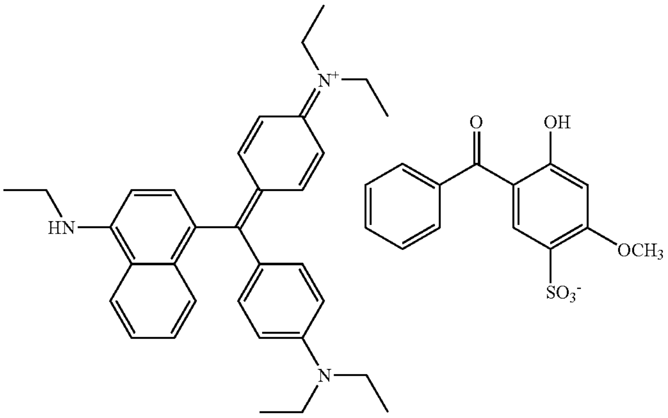

D11

Examples 1 and 2 and Comparative Examples 1–3

Silicate-coated Particles A and Particles B may be prepared by the methods disclosed in Sterman, U.S. Pat. No. 5,288,598, and in Smith, U.S. Pat. No. 3,578,577.

A coating solution (Coating Solution A) containing the ingredients shown in Table 1 was prepared.

TABLE 1

| Component | |
|---|---|
| METHYL CELLOSOLVE ® | 450.0 g |
| Methyl ethyl ketone | 450.0 g |

TABLE 1-continued

| Component | |
|---|---|
| Resole resin | 35.0 g |
| m-Cresol novolac resin | 50.0 g |
| 3-Diazo-4-methoxy-diphenylamine trifluoromethanesulfonate | 6.0 g |
| IR Dye A | 6.0 g |
| ID Dye D | 2.0 g |
| D11 | 1.0 g |
| DC190 (10% solution) | 6.0 g |

Particle-containing imageable compositions were prepared as shown in Table 2. No particles were added to the composition of Comparative Example 3.

TABLE 2

| | Example | | Comparative Example | | |
|---|---|---|---|---|---|
| Ingredient | 1 | 2 | 1 | 2 | 3 |
| Coating Solution A | 100.0 | 100.0 | 100.0 | 100.0 | 100.0 |
| Particles A | 0.05 | | | | |
| Particles B | | 0.05 | | | |
| MB20X-5 | | | 0.05 | | |
| SBX-6 | | | | 0.05 | |

All the ingredients except the particles were added to the coating solution and each of the resulting solutions filtered through a 3 micron filter. The particles were added and each of the resulting coating solutions filtered through a 10 micron filter prior to coating.

Each of the coating solutions was roll-coated onto a substrate of aluminum sheet that was electrolytically grained, anodized and treated with Lomar SN-PW (Sun Nopco) as the interlayer material. The resulting imageable element was dried for 2 minutes at 100° C. The dry coating weight of the imageable layer weight was 1.5 $g/m^2$.

These imageable elements ware imaged with CREO Trendsetter 3244 thermal exposure device (Creo Products, Burnaby, BC, Canada) having laser diode array emitting at 830 nm at 8 W and 150 rpm. The imaged imageable elements were pre-heated in a Wisconsin oven 0.76 m/min at about 141° C. (270° F.) and developed in a PK-910 processor (Kodak Polychrome Graphics) with PD1R alkaline developer (Kodak Polychrome Graphics) at 30° C., 25 sec, and coated with PF2 (Kodak Polychrome Graphics) gum solution diluted 1:1 with water to produce lithographic printing plates. The unimaged regions were removed by the developer and the imaged regions were not removed by the developer.

To evaluate each of the printing plates for blanket piling, each of the printing plates was mounted on a Roland 200 printing press (Man Roland) and evaluated using Values G Magenta ink (Dainippon Ink & Chemicals). The results are given in Table 3, in which a “good” (A) rating indicates little or no blanket piling.

TABLE 3

| | Example | | Comparative Example | | |
|---|---|---|---|---|---|
| | 1 | 2 | 1 | 2 | 3 |
| Blanket piling[a] | A | A | C | C | A |

[a]A (good); C (bad)

Little or no blanket piling was observed Example 1 and 2. The results shown in Table 3 demonstrate that particles with a silicate coating do not cause the blanket piling problems evident in Comparative Examples 1 and 2, in which the particles did not have a silicate coating.

TABLE 4

| | Example | | Comparative Example | | |
|---|---|---|---|---|---|
| | 1 | 2 | 1 | 2 | 3 |
| Transportation property[a] | A | A | A | A | C |

[a]A (good); C (bad)

To evaluate the transportation property of the imageable elements, 50 imageable elements were stacked without interleaving paper between each element. The imageable elements were handled by automatic processing equipment. More than one imageable element of Comparative Example 3 was lifted at once. Examples 1 and 2 and Comparative Examples 1 and 2 showed good transportation property, that is only one imageable element was lifted at a time.

Having described the invention, we now claim the following and their equivalents.

What is claimed is:

1. An imageable element comprising a substrate and an imageable layer over the substrate in which:

the imageable layer comprises an imageable composition and from about 0.1 wt. % to about 2 wt. % of silicate-coated polymer particles, based on the weight of the imageable layer;

the imageable layer is ink receptive;

the silicate-coated polymer particles have a diameter of from about 1 micron to about 20 microns; and the imageable element comprises a photothermal conversion material, wherein the imageable layer comprises from about 10 to about 500 silicate-coated polymer particles that have a diameter between about three to about six times the thickness of the imageable layer, per $mm^2$.

2. The imageable element of claim 1 in which:

the silicate-coated polymer particles have a diameter of from about 3 microns to about 10 microns.

3. The imageable element of claim 2 in which the imageable layer comprises the imageable composition and from about 0.2 wt. % to about 1 wt. % of silicate-coated polymer particles; and the silicate-coated polymer particles have a diameter of from about 5 microns to about 8 microns.

4. The imageable element of claim 3 in which the imageable composition is negative working.

5. The imageable element of claim 4 in which the imageable composition comprises the photothermal conversion material; an acid generator; an acid activatable crosslinking agent; and a polymeric binder.

6. The imageable element of claim 3 in which the element additionally comprises an underlayer between the imageable layer and the substrate.

7. The imageable element of claim 6 in which the underlayer comprises the photothermal conversion material.

8. The imageable element of claim 7 in which the element is positive working.

9. An imageable element comprising a substrate and an imageable layer over the substrate in which:

the imageable layer comprises an imageable composition and from about 0.1 wt. % to about 2 wt. % of silicate-coated polymer particles, based on the weight of the imageable layer;

the silicate-coated polymer particles have a diameter of from about 1 micron to about 20 microns;

the imageable layer comprises from about 10 to about 500 silicate-coated polymer particles that have a diameter between about three to about six times the thickness of the imageable layer, per $mm^2$;

the imageable element comprises a photothermal conversion material; and the imageable composition comprises the photothermal conversion material; an acid generator; an acid activatable crosslinking agent; and a polymeric binder.

10. The imageable element of claim 9 in which:

the silicate-coated polymer particles have a diameter of from about 3 microns to about 10 microns.

11. The imageable element of claim 9 in which the silicate-coated polymer particles have a diameter of from about 5 microns to about 8 microns.

12. An imageable element comprising a substrate and an imageable layer over the substrate in which:

the imageable layer comprises an imageable composition and from about 0.1 wt. % to about 2 wt. % of silicate-coated polymer particles, based on the weight of the imageable layer;

the silicate-coated polymer particles have a diameter of from about 1 micron to about 20 microns;

the imageable layer comprises from about 10 to about 500 silicate-coated polymer particles that have a diameter between about three to about six times the thickness of the imageable layer, per $mm^2$;

the imageable element comprises a photothermal conversion material; and the element additionally comprises an underlayer between the imageable layer and the substrate.

13. The imageable element of claim 12 in which:

the silicate-coated polymer particles have a diameter of from about 3 microns to about 10 microns.

14. The imageable element of claim 12 in which the silicate-coated polymer particles have a diameter of from about 5 microns to about 8 microns.

15. A method for forming an image, the method comprising the steps of:

imaging an imageable element without the use of a photomask and forming imaged regions and complementary unimaged regions in the imageable element; and developing the imageable element with a developer and removing either the imaged or the unimaged regions; in which:

the imageable element comprises an imageable layer over a substrate;

the imageable layer comprises an imageable composition and from about 0.02 wt. % to about 1 wt. % of silicate-coated polymer particles, based on the weight of the imageable layer;

the imageable layer comprises from about 10 to about 500 silicate-coated polymer particles that have a diameter between about three to about six times the thickness of the imageable layer, per $mm^2$, the silicate-coated polymer particles have a diameter of from about 5 microns to about 8 microns;

imaging is carried out with a laser that emits infrared radiation in the range of from about 800 nm to about 1200 nm;

the imageable element comprises a photothermal conversion material; and the imageable composition comprises the photothermal conversion material; an acid generator; an acid activatable crosslinking agent; and a polymeric binder.

16. A method for forming an image, the method comprising the steps of:

imaging an imageable element without the use of a photomask and forming imaged regions and complementary unimaged regions in the imageable element; and developing the imageable element with a developer and removing either the imaged or the unimaged regions; in which:

the imageable element comprises an imageable layer over a substrate;

the imageable layer comprises an imageable composition and from about 0.02 wt. % to about 1 wt. % of silicate-coated polymer particles, based on the weight of the imageable layer;

the silicate-coated polymer particles have a diameter of from about 2 microns to about 5 microns;

imaging is carried out with a laser that emits infrared radiation in the range of from about 800 nm to about 1200 nm;

the imageable element comprises a photothermal conversion material;

the imageable layer comprises from about 10 to about 500 silicate-coated polymer particles that have a diameter between about three to about six times the thickness of the imageable layer, per $mm^2$; and the element additionally comprises an underlayer between the imageable layer and the substrate.

17. The method of claim 16 in which the underlayer comprises the photothermal conversion material.

18. A stack of imageable elements in which:

the imageable elements each comprise an imageable layer over a substrate;

the imageable layer comprises an imageable composition and from about 0.1 wt. % to about 2 wt. % of silicate-coated polymer particles, based on the weight of the imageable layer;

the silicate-coated polymer particles have a diameter of from about 1 micron to about 20 microns;

the stack comprises between 20 and 1000 imageable elements; and the imageable layer of each imageable element is in direct contact with the substrate of each successive imageable element in the stack, wherein the imageable layer comprises from about 10 to about 500 silicate-coated polymer particles that have a diameter between about three to about six times the thickness of the imageable layer, per $mm^2$.

19. The stack of claim 18 in which the stack comprises about 200 to about 800 of the imageable elements.

20. The stack of claim 19 in which the silicate-coated polymer particles have a diameter of from about 5 microns to about 8 microns.

21. The stack of claim 20 in which the imageable composition comprises a photothermal conversion material; an acid generator; an acid activatable crosslinking agent; and a polymeric binder.

22. The stack of claim 20 in which each of the imageable elements additionally comprise an underlayer between the imageable layer and the substrate.

23. The stack of claim 22 in which the underlayer comprises the photothermal conversion material.

24. The stack of claim 18 in which the imageable layer comprises from about 0.2 wt. % to about 1 wt. % of silicate-coated polymer particles.

25. The stack of claim 23 in which the imageable layer is ink receptive.

26. A method for forming an image, the method comprising the steps of:

imaging an imageable element without the use of a photomask and forming imaged regions and complementary unimaged regions in the imageable element; and developing the imageable element with a developer and removing either the imaged or the unimaged regions;

in which:

the imageable element comprises an imageable layer over a substrate;

the imageable layer comprises an imageable composition and from about 0.1 wt. % to about 2 wt. % of silicate-coated polymer particles, based on the weight of the imageable layer;

wherein the imageable layer comprises from about 10 to about 500 silicate-coated polymer particles that have a diameter between about three to about six times the thickness of the imageable layer, per $mm^2$, the silicate-coated polymer particles have a diameter of from about 1 micron to about 20 microns; and imageable layer is ink receptive.

* * * * *

UNITED STATES PATENT AND TRADEMARK OFFICE

CERTIFICATE OF CORRECTION

PATENT NO. : 7,097,956 B2
APPLICATION NO. : 10/353195
DATED : August 29, 2006
INVENTOR(S) : Yasushi Miyamoto et al.

It is certified that error appears in the above-identified patent and that said Letters Patent is hereby corrected as shown below:

Col. 28, line 6 "from about 5 microns", should read --about 8 microns;--

Signed and Sealed this

Thirtieth Day of January, 2007

JON W. DUDAS

*Director of the United States Patent and Trademark Office*